(12) United States Patent
Ogata et al.

(10) Patent No.: US 10,386,216 B2
(45) Date of Patent: Aug. 20, 2019

(54) THERMAL TYPE AIR FLOW SENSOR

(71) Applicant: Hitachi Automotive Systems, Ltd., Hitachinaka-shi, Ibaraki (JP)

(72) Inventors: Masatoshi Ogata, Tokyo (JP); Norio Ishitsuka, Hitachinaka (JP); Masahiro Matsumoto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 138 days.

(21) Appl. No.: 14/773,232

(22) PCT Filed: Dec. 13, 2013

(86) PCT No.: PCT/JP2013/083412
§ 371 (c)(1),
(2) Date: Sep. 4, 2015

(87) PCT Pub. No.: WO2014/136347
PCT Pub. Date: Sep. 12, 2014

(65) Prior Publication Data
US 2016/0025539 A1    Jan. 28, 2016

(30) Foreign Application Priority Data

Mar. 8, 2013    (JP) .................................. 2013-046083

(51) Int. Cl.
*G01F 1/684* (2006.01)
*G01F 1/69* (2006.01)
(Continued)

(52) U.S. Cl.
CPC ................ *G01F 1/69* (2013.01); *G01F 1/684* (2013.01); *G01F 1/6842* (2013.01);
(Continued)

(58) Field of Classification Search
CPC ............. G01F 1/68; G01F 1/684; G01F 1/692
See application file for complete search history.

(56) References Cited

U.S. PATENT DOCUMENTS 3,965,453 A * 6/1976 Seidel ................. H01L 27/0802
338/13
5,325,712 A * 7/1994 Tsutsui .................... G01F 1/684
73/114.34
(Continued)

FOREIGN PATENT DOCUMENTS

| CN | 101046368 A | 10/2007 |
|---|---|---|
| CN | 101943590 A | 1/2011 |

(Continued)

OTHER PUBLICATIONS

International Search Report (PCT/ISA/210) dated Mar. 11, 2014, with English translation (Ten (10) pages).
(Continued)

*Primary Examiner* — Justin N Olamit
(74) *Attorney, Agent, or Firm* — Crowell & Moring LLP

(57) ABSTRACT

In order to provide a thermal flow sensor having high measurement accuracy, the thermal type air flow sensor includes a flow detecting unit, a sub passage on which the flow detecting unit is disposed, and an LSI to which a signal obtained by the flow detecting unit is input and which outputs a signal to the outside. A side wall of the sub passage is disposed between the flow detecting unit and the LSI, or on the LSI. A diffusion resistor provided inside the LSI has its longitudinal direction in parallel with a <100> orientation of single-crystal Si.

18 Claims, 7 Drawing Sheets

(51) Int. Cl.
*G01F 15/02* (2006.01)
*H01L 29/84* (2006.01)
*H01L 29/04* (2006.01)

(52) U.S. Cl.
CPC ............ *G01F 15/022* (2013.01); *H01L 29/84* (2013.01); *H01L 29/045* (2013.01)

(56) References Cited

U.S. PATENT DOCUMENTS

| | | | |
|---|---|---|---|
| 7,269,999 B2* | 9/2007 | Nakano | G01F 1/6842 73/202.5 |
| 7,270,000 B2* | 9/2007 | Nakada | G01F 1/6842 73/204.26 |
| 7,437,260 B2* | 10/2008 | Ausserlechner | G01L 5/0047 257/427 |
| 2006/0065049 A1 | 3/2006 | Nakada et al. | |
| 2007/0228500 A1 | 10/2007 | Shimazu et al. | |
| 2008/0153959 A1* | 6/2008 | Charati | C08K 3/04 524/404 |
| 2011/0000312 A1 | 1/2011 | Ueda et al. | |
| 2011/0023597 A1 | 2/2011 | Nakano et al. | |
| 2011/0107832 A1* | 5/2011 | Sakuma | G01F 1/6842 73/204.26 |
| 2011/0140211 A1* | 6/2011 | Kono | G01F 1/684 257/415 |
| 2011/0296904 A1 | 12/2011 | Tagawa et al. | |
| 2013/0025363 A1 | 1/2013 | Sato et al. | |
| 2014/0060206 A1 | 3/2014 | Fouillet et al. | |
| 2014/0360262 A1* | 12/2014 | Asano | G01F 1/684 73/204.19 |

FOREIGN PATENT DOCUMENTS

| | | |
|---|---|---|
| CN | 102822641 A | 12/2012 |
| DE | 44 39 222 A1 | 5/1996 |
| DE | 10 2010 061 348 A1 | 7/2011 |
| EP | 1 643 219 A2 | 4/2006 |
| EP | 1 879 004 A1 | 1/2008 |
| EP | 2 320 200 A1 | 5/2011 |
| JP | 09181191 A * | 7/1997 |
| JP | 2001-12985 A | 1/2001 |
| JP | 2003-315126 A | 11/2003 |
| JP | 2004-219080 A | 8/2004 |
| JP | 2010-112804 A | 5/2010 |
| JP | 2011-33366 A | 2/2011 |
| JP | 2011-148293 A | 8/2011 |
| JP | 2011-169641 A | 9/2011 |
| JP | 2011-252796 A | 12/2011 |
| JP | 2012-145496 A | 8/2012 |
| WO | WO 2012/146756 A1 | 11/2012 |

OTHER PUBLICATIONS

English translation of Japanese-language Office Action issued in counterpart Japanese Application No. 2015-232590 dated Sep. 6, 2016 (Two (2) pages).

European Search Report issued in counterpart European Application No. 13876790.0 dated Nov. 24, 2016 (eight pages).

Chinese Office Action issued in counterpart Chinese Application No. 201380074118.2 dated May 2, 2017 (seven pages).

* cited by examiner

[Fig. 1]
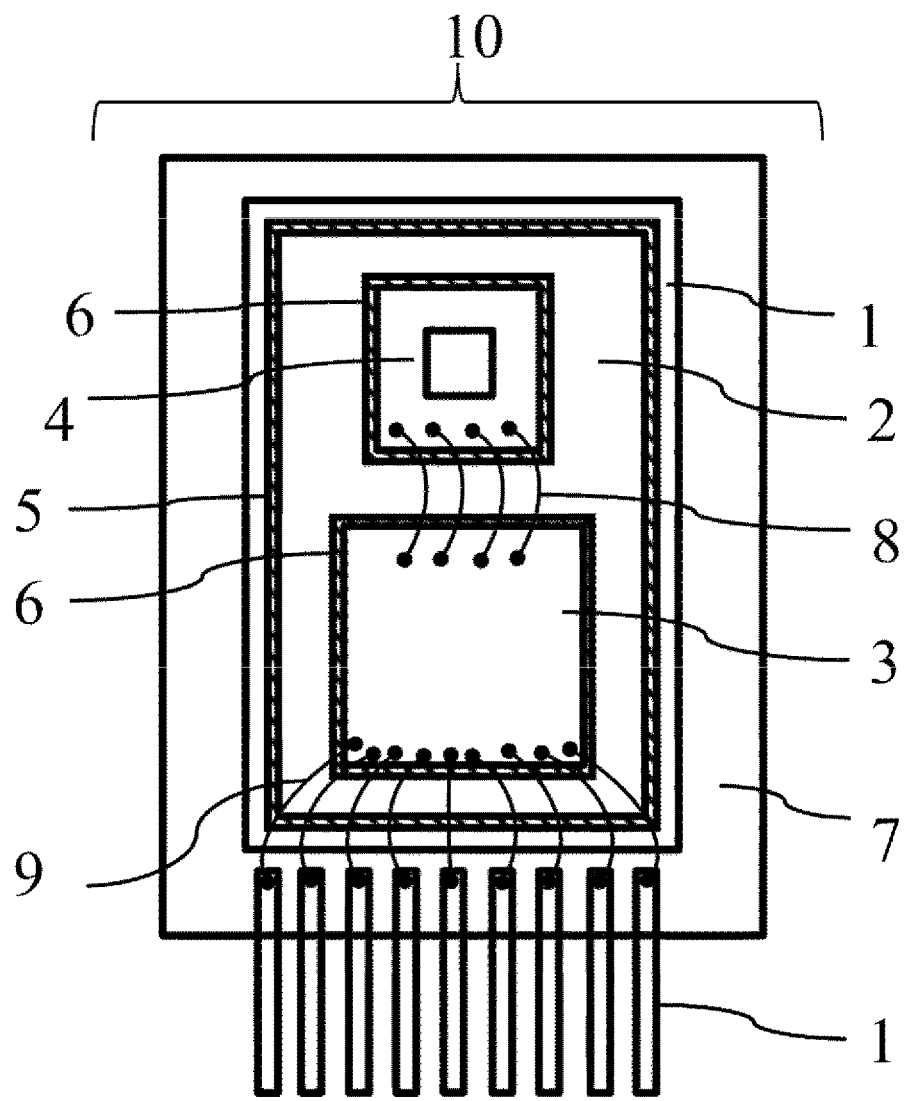

[Fig. 2]
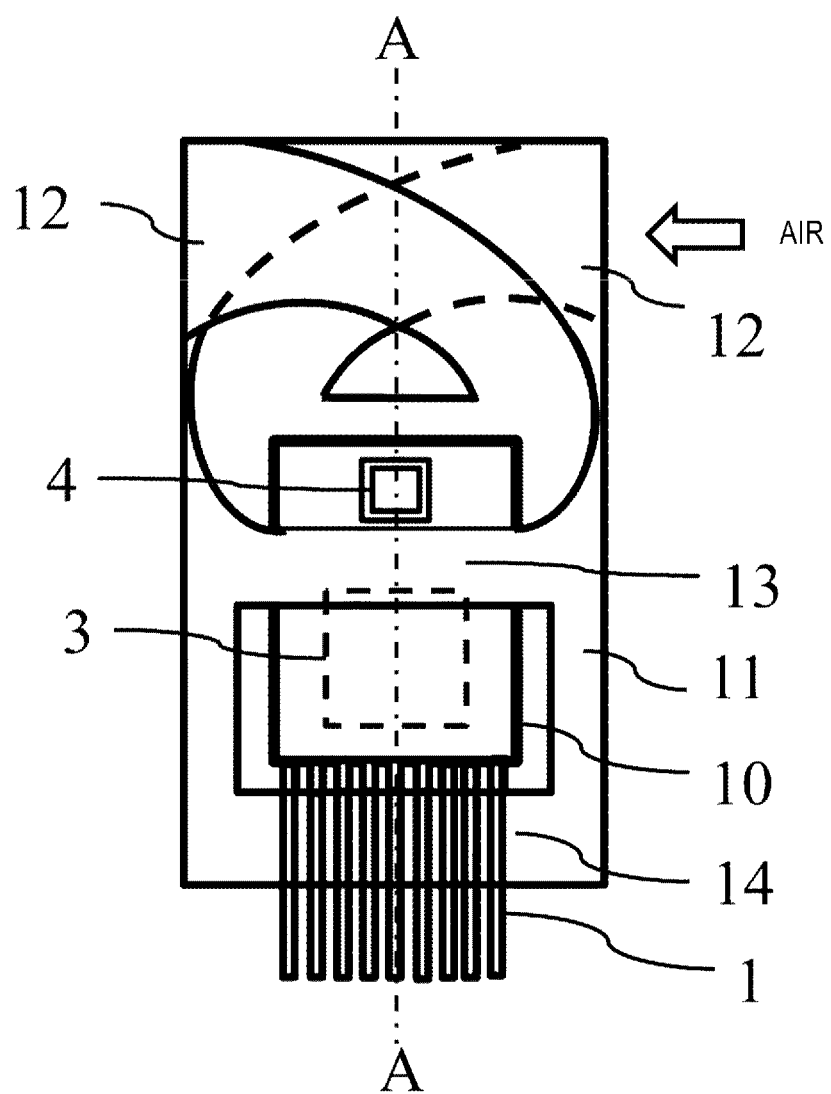

[Fig. 3]
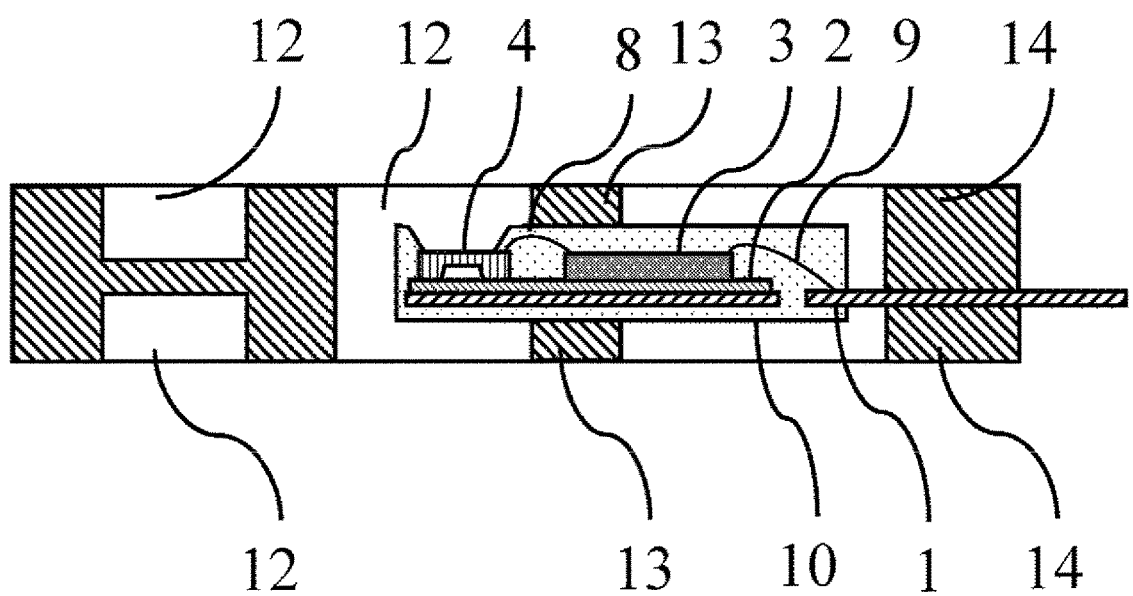

[Fig. 4]
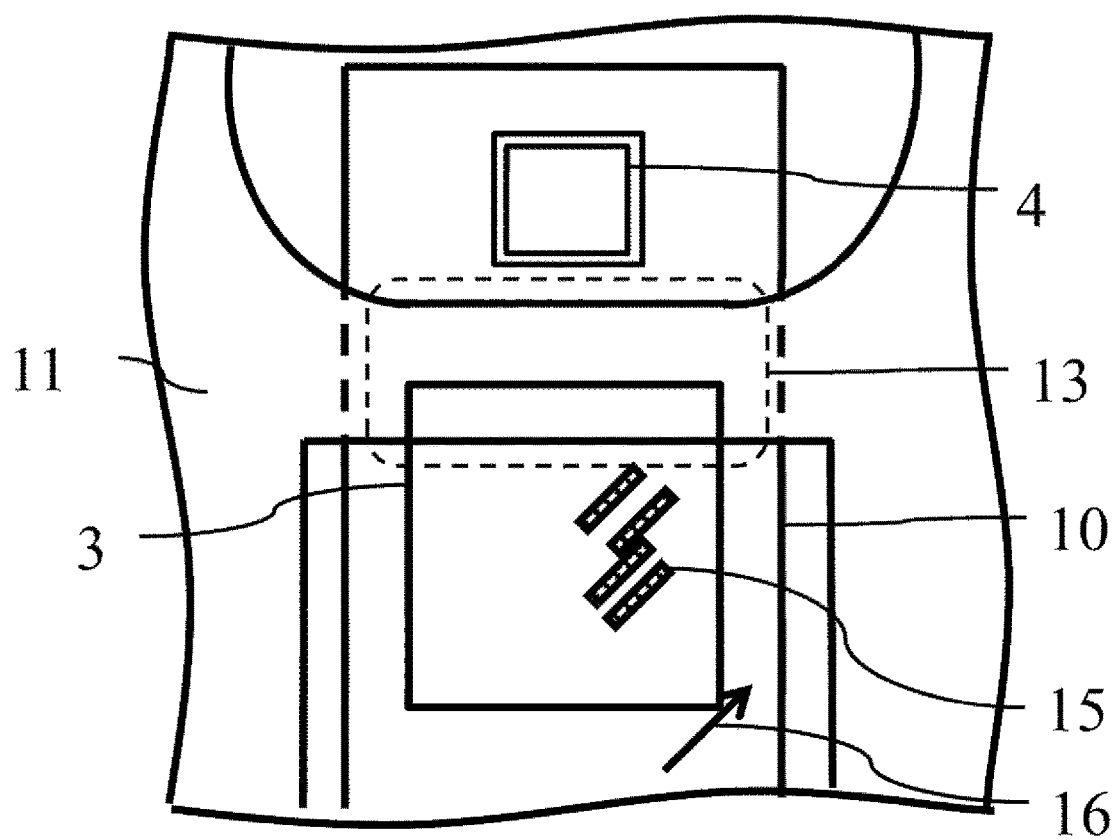

[Fig. 5]
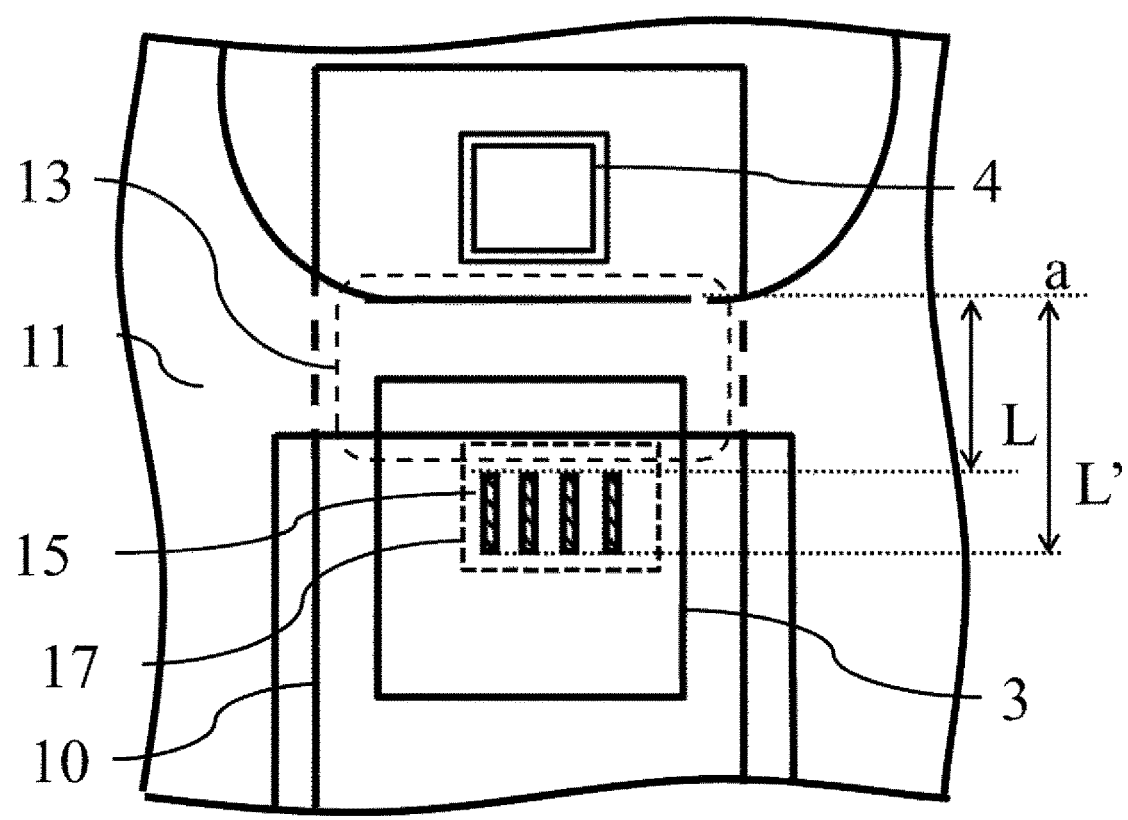

[Fig. 6]
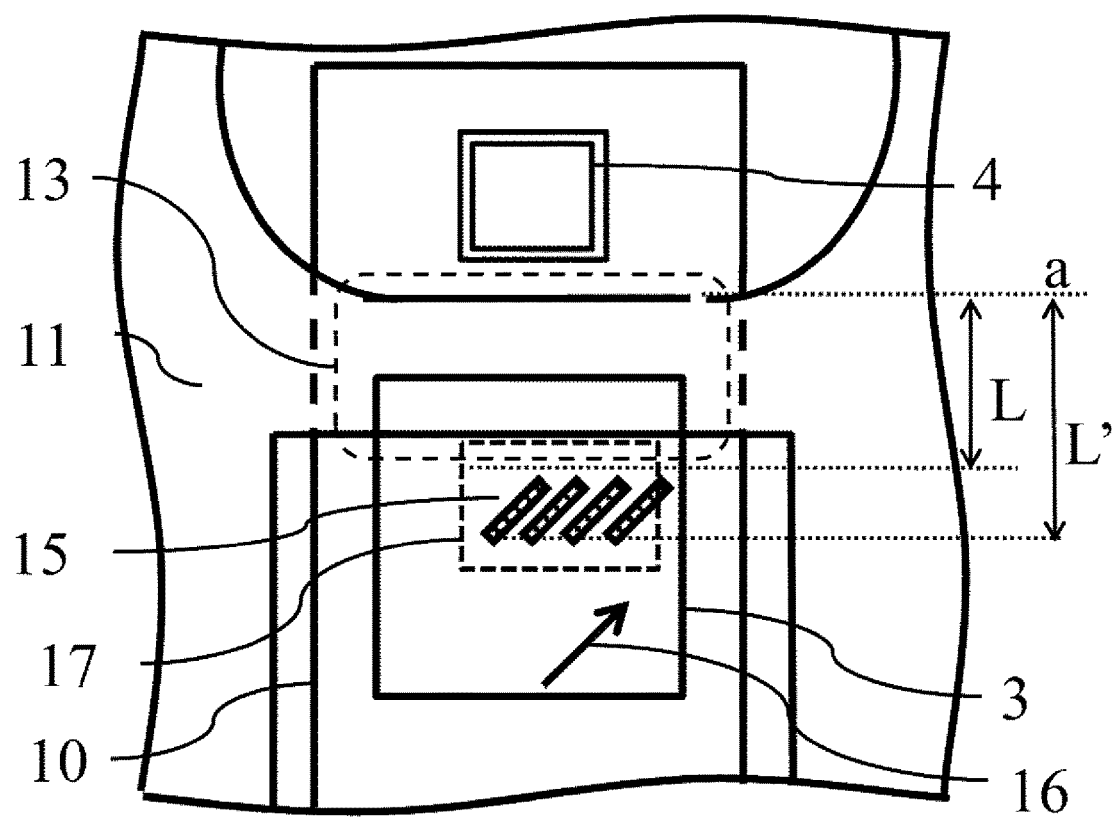

[Fig. 7]
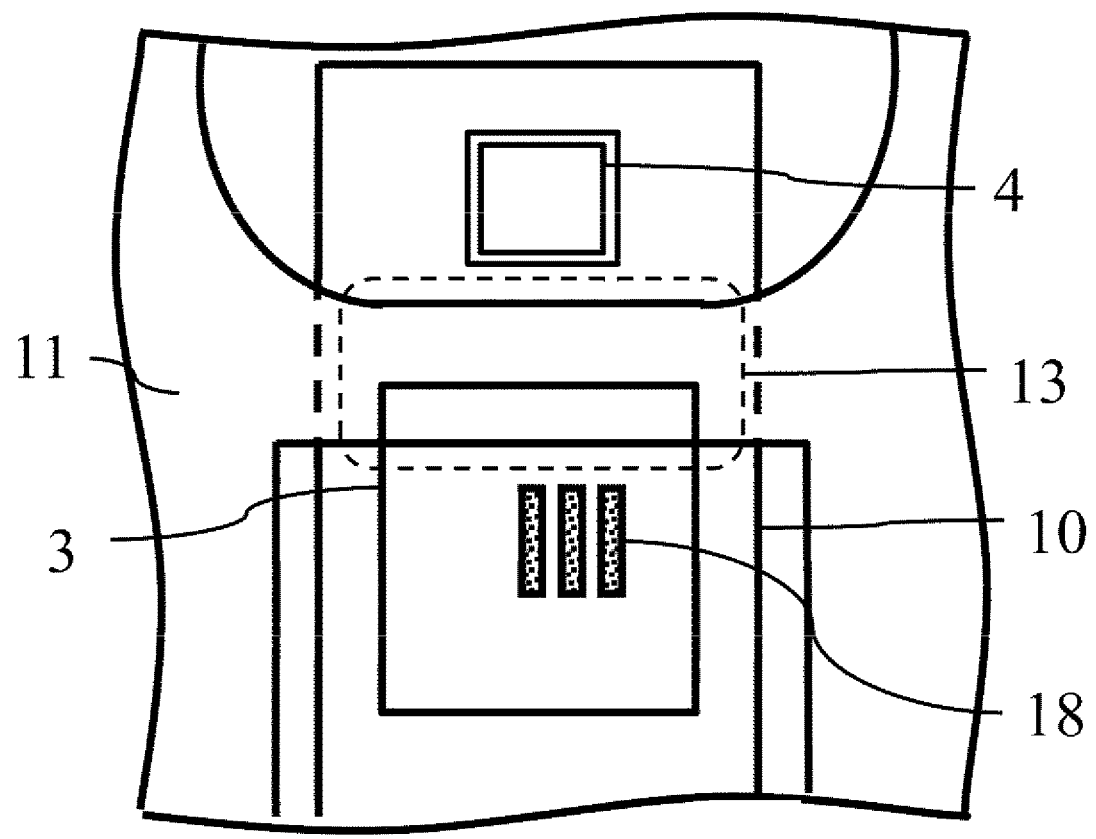

THERMAL TYPE AIR FLOW SENSOR

TECHNICAL FIELD

The present invention relates to a thermal type air flow sensor.

BACKGROUND ART

A thermal type air flow sensor that measures a flow rate of air is configured to include a flow detecting unit for measuring an air flow rate and to measure the air flow rate of a gas by causing thermal transfer between the flow detecting unit and the gas as a measurement target. The air flow rate measured by the thermal type air flow sensor is widely used as a significant control parameter in various apparatuses. The thermal type air flow sensor is distinctive in that the air flow rate can be measured with relatively high accuracy, compared to a flow sensor using another method.

However, it is desirable to achieve further improved accuracy in the air flow rate measurement. For example, in a vehicle on which an internal combustion engine is mounted, low fuel consumption or exhaust gas purification is highly demanded. In response to the demands, it is required to measure air intake as a principal parameter of the internal combustion engine with high accuracy. The thermal type air flow sensor that measures the air intake of air guided to the internal combustion engine includes a sub passage through which a part of the air intake flows and a flow detecting unit disposed on the sub passage, measures a state of a measurement target gas which flows through the sub passage by thermal transfer performed by the flow detecting unit between the measurement target gas and the flow detecting unit, and outputs an electrical signal representing the air intake guided into the internal combustion engine. For example, JP-A-2011-252796 (PTL 1) discloses such a technology.

CITATION LIST

Patent Literature

PTL 1: JP-A-2011-252796

SUMMARY OF INVENTION

Technical Problem

In order to measure air flow rate with high accuracy, a thermal type air flow sensor is required to have a flow detecting unit which is fixed at a highly accurately determined position on a sub passage that is provided in the thermal type air flow sensor to measure a flow rate of an air flowing through a main passage, and to measure the flow rate detected by the flow detecting unit with accuracy. In a technology disclosed in PTL 1, a housing having a sub passage in which a hole for fitting the flow detecting unit therein is formed is manufactured of a resin in advance, a sensor assembly which includes the flow detecting unit is manufactured separately from the housing, and then, the sensor assembly is fixed to the housing in a state in which the flow detecting unit is inserted into the hole in the sub passage. A gap between the hole in the sub passage and the flow detecting unit and a gap formed at a portion fitting to the housing of the sensor assembly are filled with an elastic adhesive and an elastic force of the adhesive acts as a counterbalance to a linear expansion difference therebetween.

In such a configuration, it is difficult for the sensor assembly that includes the flow detecting unit to be fixed to an accurately set position on the housing having the sub passage. That is, there is a problem in that the position or angle of the sub passage provided on the housing with respect to the sensor assembly is easily changed depending on a state of the adhesive. Thus, in the thermal type air flow sensor of the related art, it is difficult to improve the accuracy of the detection of the flow.

In setting a position of the flow detecting unit on the sub passage with accuracy, it is effective to fix the sensor assembly that includes the flow detecting unit at the same time of forming the housing. However, in this case, there is a problem in that greater thermal stress due to a difference between linear coefficients of expansion of the sensor assembly and a housing member is generated than in a case where the adhesive is used, an output (mainly, change of resistance due to the thermal stress) of an LSI disposed in the sensor assembly is changed and measurement accuracy of the thermal type air flow sensor is decreased.

An object of the present invention is to provide a thermal type air flow sensor having high measurement accuracy.

Solution to Problem

According to an aspect of the present invention, there is provided a thermal type air flow sensor including: a flow detecting unit; a sub passage on which the flow detecting unit is disposed; and an LSI to which a signal obtained by the flow detecting unit is input and which outputs a signal to the outside, wherein a side wall of the sub passage is disposed between the flow detecting unit and the LSI, or on the LSI, and wherein a diffusion resistor provided inside the LSI has its longitudinal direction in parallel with a <100> orientation of single-crystal Si.

Advantageous Effects of Invention

According to the present invention, a thermal type air flow sensor having high measurement accuracy can be provided.

BRIEF DESCRIPTION OF DRAWINGS

FIG. 1 is a plan view of a sensor assembly according to Example 1 of the present application.

FIG. 2 is a plan view of a thermal type air flow sensor according to Example 1 of the present application.

FIG. 3 is a sectional view of the thermal type air flow sensor according to Example 1 of the present application.

FIG. 4 is a view illustrating resistor arrangement according to Example 1 of the present application.

FIG. 5 is a view illustrating a resistor arrangement according to Example 2 of the present application.

FIG. 6 is a view of a change in resistor arrangement according to Example 2 of the present application.

FIG. 7 is a view illustrating resistor bodies according to Example 3 of the present application.

DESCRIPTION OF EMBODIMENTS

Hereinafter, examples of the present invention will be described using the drawings.

Example 1

Example 1 as an example of a thermal type air flow sensor of the present invention will be described. As illustrated in FIG. 1, the sensor assembly 10 includes a lead frame 1, a glass plate 2, an LSI 3, and a sensor chip 4, which are covered with a first resin 7. The glass plate 2 adheres to the lead frame 1 using a resin film 5 and the LSI 3 and the sensor chip 4 adhere to the glass plate 2 using a resin film 6. Gold wires 8 and 9 electrically connect between the LSI 3 and the sensor chip 4 and between and the LSI 3 and the lead frame 1, respectively, using wires by wire bonding. The processed product is molded using the first thermosetting resin 7 and then, the sensor assembly 10 is produced. The LSI 3 converts and controls an analog signal from the sensor chip 4 configured of a flow detecting unit into a digital signal, and outputs the digital signal.

FIG. 2 is a front view of the housing 11 having a sub passage and the sensor assembly 10 and FIG. 3 is a sectional view taken along a two-dashed and dotted line A-A in FIG. 2. In order to guide air flowing through the main passage to the sensor chip 4, the housing 11 includes the sub path groove 12, a holding section 13 of the sensor assembly 10, and a holding section 14 of the lead frame 1. The sensor assembly 10 is fixed to the housing 11 having a sub passage at the same time of forming the housing 11 and the housing 11 is formed of a second thermoplastic resin. Since the sensor chip 4 configured of the flow detecting unit measures air flow rate, the sensor chip 4 is disposed at an intermediate position of the sub path groove 12. Thus, the sensor assembly 10 is fixed by the holding section 13 between the sensor chip 4 and the LSI 3 or immediately above and around the LSI 3.

FIG. 4 is a view schematically illustrating an arrangement direction of diffusion resistor bodies 15 inside the LSI 3. The LSI 3 is formed of single-crystal Si and the diffusion resistor bodies 15 inside the LSI 3 are arranged such that a <100> crystal orientation direction 16 is parallel with the longitudinal direction of the diffusion resistor body 15.

Next, effects of Example 1 will be described. The sensor assembly 10 is fixed by being integrally molded with the housing 11 while being molded with the second resin. Thus, positional accuracy of the sensor chip 4 inside the sensor assembly 10 is improved and measurement accuracy of the air flow rate is improved. The housing 11 includes the sub path groove 12 having the sensor chip 4. Since the sensor assembly 10 is fixed by the holding section 13, the LSI 3 is disposed immediately below and around the holding section 13. Since the sensor assembly 10 is formed of the first resin and the housing 11 is formed of the second resin, thermal stress due to a difference of a linear coefficient of expansion between the first resin and the second resin or contraction stress due to a resin contraction difference is produced on the boundary (vicinity of LSI 3) between the holding section 13 and the sensor assembly 10.

Here, when stress (strain) is produced in a resistor body, a resistance value is changed due to a piezoresistance effect. The change of the resistance value due to the piezoresistance effect becomes a function of the piezoresistance coefficient and strain produced in the resistor. In addition, a piezoresistance coefficient strongly depends on a crystal direction of single-crystal Si and the minimum piezoresistance coefficient is obtained when the resistor body is disposed to have its longitudinal direction in parallel with the <100> crystal orientation direction 16. According to the present example, since the diffusion resistor body 15 is disposed to have its longitudinal direction in parallel with the <100> crystal orientation direction 16, the change of the resistance value produced due to the strain can be small, an output change of the LSI is suppressed, and accuracy of the flow measurement accuracy is improved.

Example 2

Example 2 of the thermal type air flow sensor will be described. The sensor assembly 10 and the housing 11 have the same configuration as Example 1.

FIG. 5 is a view schematically illustrating a positional relationship between the holding section 13 and the diffusion resistor bodies 15 inside the LSI 3. The diffusion resistor body 15 inside the LSI 3 is a resistor body provided in a circuit 17 which is referred to as, for example, an A/D converting circuit and in which an output is controlled in response to a ratio of the resistance in the circuit. The A/D converting circuit converts an analog signal obtained from the sensor chip 4 into a digital signal such that the analog signal can be processed in the LSI 3. The circuit is configured to have an integral multiple of the number of resistor bodies. The diffusion resistor bodies 15 are positioned such that an end a of the holding section 13 provided in the housing 11 and respective ends of the diffusion resistor bodies 15 on one side are spaced by an equal distance L and the end a of the holding section 13 and respective ends of the diffusion resistor bodies 15 on the other end are spaced by an equal distance L'. Further, an integral multiple of the number of resistor bodies is prepared using the resistor bodies having the same length.

Next, effects according to Example 2 of the thermal type air flow sensor will be described. The thermal stress due to the difference of a linear coefficient of expansion between the first resin and the second resin or the contraction stress due to the resin contraction difference is produced in the diffusion resistor body 15 inside the LSI 3. The resistance value change due to the piezoresistance effect is produced in the diffusion resistor body 15 and the resistance change becomes a function of piezoresistance coefficient and the strain produced in the resistor body. According to Example 2, the diffusion resistor bodies 15 are arranged to be spaced from the end a of the holding section 13 which is a stress generating source by the same distance and the respective resistor bodies have the same thermal strain distribution. In addition, an integral multiple of the number of resistor bodies is prepared using the resistor bodies having the same length. Thus, the resistance value change due to the piezoresistance effect is the same in the respective diffusion resistor bodies 15 and it is possible to offset the influence of the thermal stress in the A/D converting circuit or the like in which the output is controlled in response to a ratio of the resistance values. Thus, it is possible to decrease the influence of the thermal stress generated in the LSI 3 and it is possible to improve the measurement accuracy of air flow rate. As illustrated in FIG. 6, needless to say, when the diffusion resistor bodies 15 are arranged to have their longitudinal direction in parallel with the <100> crystal orientation direction 16, it is possible to decrease the influence of the thermal stress, in addition to the present example.

Example 3

Example 3 of the thermal type air flow sensor will be described. The sensor assembly 10 and the housing 11 have the same structure as in Example 1. According to Example 3, as illustrated in FIG. 7, the diffusion resistor bodies inside the LSI 3 are changed to polysilicon resistors 18.

Next, effects according to Example 3 of the thermal type air flow sensor will be described. The piezoresistance coefficient of Si becomes great in a <110> crystal direction and becomes the smallest in the <100> crystal direction. When the resistor body is formed of a polysilicon film, crystal grains in the polysilicon film grow in various directions and therefore, the piezoresistance coefficient is averaged. Thus, the piezoresistance coefficient of the diffusion resistor body in its longitudinal direction becomes smaller than that in the <110> crystal direction. It is possible to decrease the influence of the thermal stress generated in the LSI 3 and it is possible to improve the measurement accuracy of the air flow rate.

According to the present example, the diffusion resistor bodies inside the LSI 3 are changed to the polysilicon resistors 18; however, since the strain has little influence on a position far away from the holding section 13, it is needless to say that the resistors inside the LSI 3 may not all be formed of the polysilicon resistors. It is needless to say that the diffusion resistor body 15 of the A/D converting circuit is formed of the polysilicon film as in Example 2 and thereby, it is possible to decrease the influence of the stress.

REFERENCE SIGNS LIST 1 lead frame
2 glass plate
3 LSI
4 sensor chip
5 resin film
6 resin film
7 first resin
8 gold wire
9 gold wire
10 sensor assembly
11 housing
12 sub path groove
13 sensor assembly holding section
14 lead frame holding section
15 diffusion resistor body
16 <100> crystal orientation direction
17 circuit
18 polysilicon resistor

The invention claimed is:

1. A thermal type air flow sensor comprising: a flow detecting unit;
   a sub passage in which the flow detecting unit is disposed and the sub passage is configured to guide air flowing through a main passage to the flow detecting unit; and
   an LSI to which a signal obtained by the flow detecting unit is input and which outputs a signal;
   wherein a side wall of the sub passage is disposed on a resin covering the flow detecting unit and the LSI, and the side wall is disposed: (i) between the flow detecting unit and the LSI or (ii) on the LSI,
   wherein the side wall of the sub passage is formed by a side wall of a holding section, the holding section being configured to hold the flow detecting unit in the sub passage by a first part of the holding section arranged above the flow detecting unit and by a second part of the holding section arranged below the flow detecting unit, and
   wherein resistor bodies provided in an A/D converting circuit which converts the signal from the flow detecting unit inside the LSI are disposed so that respective first ends of a plurality of the resistor bodies are at a first distance from the side wall of the sub passage laterally to one side of the holding section, and so that respective second ends of the plurality of resistor bodies are disposed at a second distance from the side wall of the sub passage and to said one side of the holding section and laterally to said one side of the holding section.

2. The thermal type air flow sensor according to claim 1, wherein the resistor bodies include diffusion resistor bodies that are formed of polysilicon.

3. The thermal type air flow sensor according to claim 1, wherein the LSI is formed of single-crystal Si and the resistor bodies provided in the A/D converting circuit which converts the signal from the flow detecting unit the LSI include diffusion resistor bodies having longitudinal axes positioned in a direction parallel relative to a <100> orientation of the single-crystal Si of the LSI.

4. The thermal type air flow sensor according to claim 3, wherein the resin is a thermosetting resin.

5. The thermal type air flow sensor according to claim 3, wherein the sub passage is molded using a thermoplastic resin.

6. The thermal type air flow sensor according to claim 3, wherein the LSI is buried in the resin.

7. The thermal type air flow sensor according to claim 3, wherein the side wall of the sub passage is directly disposed on the resin covering the flow detecting unit and the LSI.

8. The thermal type air flow sensor according to claim 3, wherein the resin covering the flow detecting unit and the LSI is fixed by the side wall of the sub passage at the same time of forming the sub passage.

9. The thermal type air flow sensor according to claim 3, wherein the resin covering the flow detecting unit and the LSI is fixed on sides of both the flow detecting unit and the LSI.

10. The thermal type air flow sensor according to claim 4, wherein the holding section and the plurality of resistor bodies have a positional relationship such that the first distance is substantially the same for the plurality of resistor bodies and the second distance is substantially the same for the plurality of resistor bodies.

11. The thermal type air flow sensor according to claim 1, wherein the resin is a thermosetting resin.

12. The thermal type air flow sensor according to claim 1, wherein the sub passage is molded using a thermoplastic resin.

13. The thermal type air flow sensor according to claim 1, wherein the LSI is buried in the resin.

14. The thermal type air flow sensor according to claim 1, wherein the side wall of the sub passage is directly disposed on the resin covering the flow detecting unit and the LSI.

15. The thermal type air flow sensor according to claim 1, wherein the resin covering the flow detecting unit and the LSI is fixed by the side wall of the sub passage at the same time of forming the sub passage.

16. The thermal type air flow sensor according to claim 1, wherein the resin covering the flow detecting unit and the LSI is fixed on sides of both the flow detecting unit and the LSI.

17. The thermal type air flow sensor according to claim 1, wherein each of said plurality of resistor bodies includes one of the first ends and one of the second ends.

18. The thermal type air flow sensor according to claim 1, wherein the holding section and the plurality of resistor bodies have a positional relationship such that the first distance is substantially the same for the plurality of resistor bodies and the second distance is substantially the same for the plurality of resistor bodies.

* * * * *